(12) United States Patent
Fakhry et al.

(10) Patent No.: US 6,691,288 B1
(45) Date of Patent: Feb. 10, 2004

(54) METHOD TO DEBUG IKOS METHOD

(75) Inventors: Nader Fakhry, Portland, OR (US); Viswanathan Lakshmanan, Westminster, CO (US); Jayendra P. Gagvani, Ft. Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 85 days.

(21) Appl. No.: 10/034,535

(22) Filed: Dec. 27, 2001

(51) Int. Cl.[7] .................................................. G06F 17/50
(52) U.S. Cl. ..................... 716/4; 716/3; 716/7; 716/18; 703/15
(58) Field of Search ............................... 716/3, 4, 7, 18; 703/15

(56) References Cited

U.S. PATENT DOCUMENTS

| | | | |
|---|---|---|---|
| 6,240,376 B1 * | 5/2001 | Raynaud et al. | 703/15 |
| 6,336,087 B2 * | 1/2002 | Burgun et al. | 703/15 |
| 6,587,995 B1 * | 7/2003 | Duboc et al. | 716/4 |

OTHER PUBLICATIONS

Marantz, J., "Enhanced visibility and performance in functional verification by reconstruction" Design Automation Conference, 1998. Proceedings, Jun. 15–19, 1998 pp. 164–169.*

Wang et al., Incremental netlist compilation for IKOS hardware logic simulator ASIC Seminar and Exhibit, 1989. Proceedings., Second Annual IEEE, Sep. 25–28, 1989 pp. P9–3/1–4.*

* cited by examiner

Primary Examiner—Vuthe Siek
Assistant Examiner—Andrea Liu
(74) Attorney, Agent, or Firm—Trexler, Bushnell, Giangiorgi, Blackstone & Marr Ltd.

(57) ABSTRACT

A method of debugging an IKOS model. The method includes mapping information contained in either a .pin or .lde file or both into corresponding files which are more user-friendly, readable and editable. Preferably, a .v file which is readable to create a schematic view of the cell is also created and the schematic view can be viewed and analyzed. Then, the one or more user-friendly files which have been created can be read and edited, and the .pin and/or the .lde file is re-created. Then, a tool is used to analyze the .pin and .lde files again and determine whether there is a functional or timing failure.

18 Claims, 9 Drawing Sheets

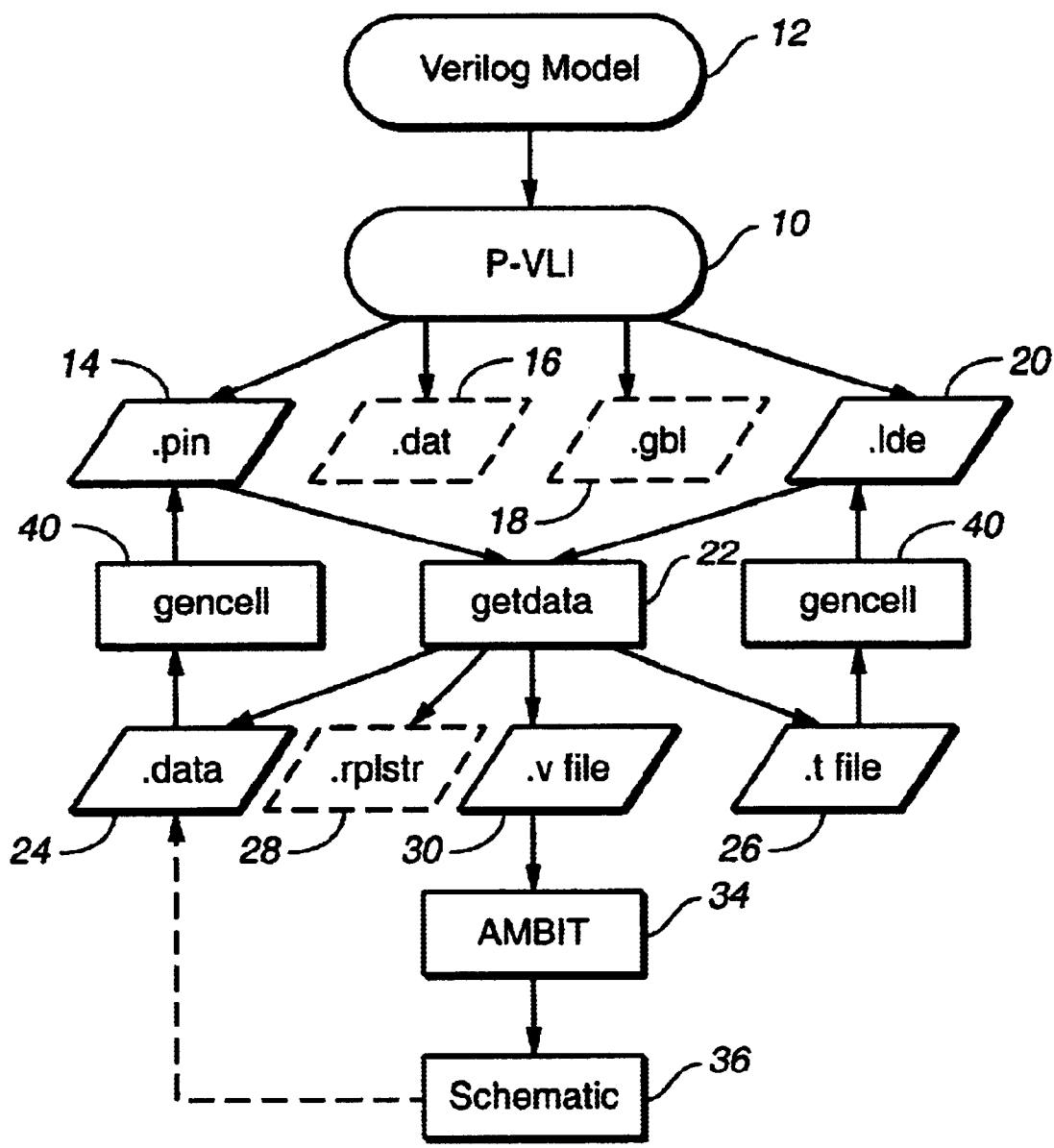
FIG._1

```
PINLIST,2                    DATA,3,CPLL_NOR              DATA,2,CP4FF_AND
(DRAWING,FDN1QA.DWG,1-1      DATA,90,3                    DATA,3,CP4FF_AND
(SYM,0                       PIN,,CP,1,5,23,0             DATA,90,0
DATA,2,I0                    PIN,,CPX,1,5,23,1            PIN,,s2,1,5,23,0
DATA,3,INP                   PIN,,,1,5,23,2               PIN,,s4,1,5,23,1
PIN,,CPN,1,5,21,Z            PIN,,,1,5,23,3               PIN,,,1,5,23,2
)                            PIN,,CPX_CL,1,5,21,Z         PIN,,,1,5,23,3
(SYM,1                       )                            PIN,,CP2FLOP,1,5,21,Z
DATA,2,I1                    (SYM,8                       )
DATA,3,INP                   DATA,2,CP_XDET               (SYM,14
PIN,,D,1,5,21,Z              DATA,3,CP_XDET               DATA,2,DNEQ_XDET
)                            DATA,90,31                   DATA,3,DNEQ_XDET
(SYM,2                       PIN,,CP,1,5,23,0             DATA,90,31
DATA,2,O2                    PIN,,,1,5,23,1               PIN,,DXQ,1,5,23,0
DATA,3,OUT                   PIN,,,1,5,23,2               PIN,,,1,5,23,1
PIN,,Q,1,5,23,0              PIN,,VCC,1,5,23,3            PIN,,,1,5,23,2
)                            PIN,,CPX,1,5,21,Z            PIN,,VCC,1,5,23,3
(SYM,3                       )                            PIN,,DXQX,1,5,21,Z
DATA,2,NOT                   (SYM,9                       )
DATA,3,NOT                   DATA,2,CL_AND                (SYM,15
DATA,90,1                    DATA,3,CL_AND                DATA,2,SET_AND
PIN,,CPN,1,5,23,0            DATA,90,0                    DATA,3,SET_AND
PIN,,,1,5,23,1               PIN,,DNEQ,1,5,23,/0          DATA,90,0
PIN,,,1,5,23,2               PIN,,Q_FAST,1,5,23,/1        PIN,,DNEQ,1,5,23,/0
PIN,,,1,5,23,3               PIN,,,1,5,23,2               PIN,,Q_FAST,1,5,23,1
PIN,,CP,1,5,21,Z             PIN,,,1,5,23,3               PIN,,,1,5,23,2
)                            PIN,,CL2FLOP,1,5,21,Z        PIN,,,1,5,23,3
(SYM,4                       )                            PIN,,SET2FLOP,1,5,21,Z
DATA,2,FAST_FLOP             (SYM,10                      )
DATA,3,FAST_FLOP             DATA,2,U5903                 (SYM,16
DATA,90,44                   DATA,3,U5903                 DATA,2,U5907
PIN,,D,1,5,23,0              DATA,90,45                   DATA,3,U5907
PIN,,CP2FLOP,1,5,23,1        PIN,,VCC,1,5,23,0            DATA,90,7
PIN,,CL2FLOP,1,5,23,2        PIN,,GND,1,5,23,1            PIN,,CPX,1,5,23,0
PIN,,SET2FLOP,1,5,23,3       PIN,,CPX_CL,1,5,23,2         PIN,,,1,5,23,1
PIN,,Q_FAST,1,5,21,Z         PIN,,CPX,1,5,23,3            PIN,,SET2FLOP,1,5,23,2
)                            PIN,,HOLDER,1,5,21,Z         PIN,,CL2FLOP,1,5,23,3
(SYM,5                       )                            PIN,,s4,1,5,21,Z
DATA,2,Q_FLOP                (SYM,11                      )
DATA,3,Q_FLOP                DATA,2,CPLL_NAND             (SYM,17
DATA,90,44                   DATA,3,CPLL_NAND             DATA,2,DNEQ_XOR
PIN,,D,1,5,23,0              DATA,90,1                    DATA,3,DNEQ_XOR
PIN,,CP2FLOP,1,5,23,1        PIN,,CP,1,5,23,0             DATA,90,4
PIN,,CL2FLOP,1,5,23,2        PIN,,HOLDER,1,5,23,1         PIN,,Q_FAST,1,5,23,0
PIN,,SET2FLOP,1,5,23,3       PIN,,,1,5,23,2               PIN,,D,1,5,23,1
PIN,,Q,1,5,21,Z              PIN,,,1,5,23,3               PIN,,,1,5,23,2
)                            PIN,,CP_HELD,1,5,21,Z        PIN,,,1,5,23,3
(SYM,6                       )                            PIN,,DXQ,1,5,21,Z
DATA,2,DNEQ_OR               (SYM,12                      )
DATA,3,DNEQ_OR               DATA,2,CPLL_AND              (SYM,18
DATA,90,2                    DATA,3,CPLL_AND              DATA,2,U5908
PIN,,DXQX,1,5,23,0           DATA,90,0                    DATA,3,U5908
PIN,,DXQ,1,5,23,1            PIN,,CP,1,5,23,0             DATA,90,0
PIN,,,1,5,23,2               PIN,,CP_HELD,1,5,23,1        PIN,,,1,5,23,0
PIN,,,1,5,23,3               PIN,,,1,5,23,2               PIN,,,1,5,23,1
PIN,,DNEQ,1,5,21,Z           PIN,,,1,5,23,3               PIN,,DNEQ,1,5,23,2
)                            PIN,,s2,1,5,21,Z
(SYM,7                       )
DATA,2,CPLL_NOR              (SYM,13
```

*FIG. 2*

```
PIN,,,1,5,23,3
PIN,,s3,1,5,21,Z
)
(SYM,19
DATA,2,U5901
DATA,3,U5901
DATA,90,0
PIN,,,1,5,23,0
PIN,,,1,5,23,1
PIN,,DNEQ,1,5,23,2
PIN,,,1,5,23,3
PIN,,s1,1,5,21,Z
)
(SYM,20
DATA,2,CP_MINLOW
DATA,3,CP_MINLOW
DATA,90,164
PIN,,,1,5,23,0
PIN,,CPN,1,5,23,1
PIN,,,1,5,23,2
PIN,,,1,5,23,3
PIN,,,1,5,21,Z
)
(SYM,21
DATA,2,U5904
DATA,3,U5904
DATA,85,00-Z-FAST_FLOP-2
DATA,85,01-Z-Q_FLOP-2
DATA,85,03-Z-FAST_FLOP-3
DATA,85,04-Z-Q_FLOP-3
DATA,90,164
PIN,,,1,5,23,0
PIN,,CPN,1,5,23,1
PIN,,s3,1,5,23,2
PIN,,,1,5,23,3
PIN,,,1,5,21,Z
)
(SYM,22
DATA,2,U5905
DATA,3,U5905
DATA,90,164
PIN,,,1,5,23,0
PIN,,CPN,1,5,23,1
PIN,,,1,5,23,2
PIN,,,1,5,23,3
PIN,,,1,5,21,Z
)
(SYM,23
DATA,2,U5902
DATA,3,U5902
DATA,85,00-Z-FAST_FLOP-2
DATA,85,01-Z-Q_FLOP-2
DATA,85,03-Z-FAST_FLOP-3
DATA,85,04-Z-Q_FLOP-3
DATA,90,160
PIN,,,1,5,23,0
PIN,,D,1,5,23,1
PIN,,,1,5,23,2
PIN,,CP,1,5,23,3
PIN,,,1,5,21,Z
)
(SYM,24
DATA,2,U5906
DATA,3,U5906
DATA,85,00-Z-FAST_FLOP-2
DATA,85,01-Z-Q_FLOP-2
DATA,85,03-Z-FAST_FLOP-3
DATA,85,04-Z-Q_FLOP-3
DATA,90,164
PIN,,,1,5,23,0
PIN,,CPN,1,5,23,1
PIN,,s1,1,5,23,2
PIN,,,1,5,23,3
PIN,,,1,5,21,Z
)
(SYM,25
DATA,2,D_HOLD_CP
DATA,3,D_HOLD_CP
DATA,85,00-Z-FAST_FLOP-2
DATA,85,01-Z-Q_FLOP-2
DATA,85,03-Z-FAST_FLOP-3
DATA,85,04-Z-Q_FLOP-3
DATA,90,161
PIN,,,1,5,23,0
PIN,,D,1,5,23,1
PIN,,,1,5,23,2
PIN,,CP,1,5,23,3
PIN,,,1,5,21,Z
)
)
```

*FIG._3*

```
Cell Name: FDN1QA
Primary port
Input(s) : CPN D
Output(s): Q
Netlist Connections
nand   <NOT>         (CP CPN [1] [2] [3]        )
DFFQ      <FAST_FLOP> (Q_FAST D CP2FLOP CL2FLOP SET2FLOP)
DL     <U5903>     (HOLDER VCC GND CPX_CL CPX)
DFFQ       <Q_FLOP>    (Q D CP2FLOP CL2FLOP SET2FLOP)
nand  <CPLL_NAND> (CP_HELD CP HOLDER [2] [3]   )
PW_CK             <CP MINLOW> (DUM [0] CPN [2] [3]   )
   or    <DNEQ_OR>     (DNEQ DXQX DXQ [2] [3]   )
   and   <CPLL_AND>    (s2 CP CP_HELD [2] [3]   )
PW_CK     <U5904>    (DUM [D:21][0] CPN s3 [3]  )
   nor   <CPLL_NOR>    (CPX_CL CP CPX [2] [3]   )
   and   <CP4FF_AND>   (CP2FLOP s2 s4 [2] [3]   )
XDET <CP_XDET>       (CPX CP [1] [2] VCC   )
PW_CK     <U5905>    (DUM [0] CPN [2] [3]   )
XDET <DNEQ_XDET>    (DXQX DXQ [1] [2] VCC   )
   and   <CL_AND>  (CL2FLOP /DNEQ /Q_FAST [2] [3] )
D_SU_CK    <U5902>     (DUM [D:23][0] D [2] CP   )
   and   <SET_AND> (SET2FLOP /DNEQ Q_FAST [2] [3] )
oai    <U5907>    (s4 CPX[1] SET2FLOP CL2FLOP)
PW_CK     <U5906>    (DUM [D:24][0] CPN s1 [3]  )
xor   <DNEQ_XOR> (DXQ Q_FAST D [2] [3]   )
D_HD_CK   <D_HOLD_CP> (DUM[D:25][0] D[2] CP   )
   and   <U5908>     (s3 [0] [1] DNEQ [3]       )
   and   <U5901>     (s1 [0] [1] DNEQ [3]       )
Note:
-----
Left Justified Margin defaulting to 30
Right Justified Margin defaulting to 30
Format signal default to 8
Use the option <-opn on> if you like to get a opcode number
Rename signal default to s
This option is REQUIRED if used to create a pin file
Max opcode length defaulting to 15
Netlist with instance (Use: <-v on> if a verilog like netlist is needed)
Max instance length defaulting to 15
Netlist without notes inside data file do not use <-wn on>
Max instance length defaulting to 9
Instance renamed string set to: U13444
Replaced Instances in FDN1QAFP.pin :
Replaced Strings in FDN1QAFP.pin :
              s
Replaced DATA,85 sequences in FDN1QAFP.pin :
00-Z-FAST_FLOP-2;01-Z-Q_FLOP-2;03-Z-FAST_FLOP-3;04-Z-Q_FLOP-3; Data85:21
Data85:
00-Z-FAST_FLOP-2;01-Z-Q_FLOP-2;03-Z-FAST_FLOP-3;04-Z-Q_FLOP-3; Data85:23
00-Z-FAST_FLOP-2;01-Z-Q_FLOP-2;03-Z-FAST_FLOP-3;04-Z-Q_FLOP-3; Data85:24
00-Z-FAST_FLOP-2;01-Z-Q_FLOP-2;03-Z-FAST_FLOP-3;04-Z-Q_FLOP-3; Data85:25
Warning:
--------
```

*FIG._4*

```
FILEVER 3.0 ;
PINLIST FDN1QA.pin ;
INPUT CPN = CPN ;
INPUT D = D ;
OUTPUT Q = Q ;

///// Pin to Pin I/O Path Delay /////
delaypath CPN minhigh = 10:0:0;
delaypath CPN minlow = 10:0:0;
delaypath CPN to Q h1 = 10:0:0;
delaypath CPN to Q 1h = 10:0:0;
delaypath D hold CPN 1h = 10:0:0;
delaypath D setup CPN 1h = 10:0:0;

///// Primitives /////
PRIMITIVE NOT :
FPP0 :
FPP0_FUNC ;

PRIMITIVE FAST_FLOP :
FPP0:
FPP0_FUNC ;

PRIMITIVE Q_FLOP :
PA1_IKOS :
FPP1_FUNC :
1R= 'CPN to Q 1h' :
1F = 'CPN to Q h1' ;

PRIMITIVE CP_XDET :
FPP0 :
FPP0_FUNC ;

PRIMITIVE DNEQ_XDET :
FPP0 :
FPP0_FUNC ;

PRIMITIVE DNEQ_XOR :
FPP0 :
FPP0_FUNC ;

PRIMITIVE DNEQ_OR :
FPP0 :
FPP0_FUNC ;

PRIMITIVE CPLL_NOR :
FPP0 :
FPP0_FUNC ;

PRIMITIVE U5903 :
FPP0 :
FPP0-FUNC ;

PRIMITIVE CPLL_NAND :
FPP0 :
FPP0_FUNC ;

PRIMITIVE CPLL_AND :
FPP0 :
FPP0_FUNC;

PRIMITIVE CP4FF_AND :
FPP0 :
FPP0_FUNC ;

PRIMITIVE SET_AND :
FPP1 :
FPP1_FUNC ;

PRIMITIVE CL_AND:
FPP1 :
FPP1_FUNC ;

PRIMITIVE U5907 :
FPP0 :
FPP0_FUNC ;

PRIMITIVE CP_MINLOW :
PA2 :
FPP0_FUNC :
1F = 'CPN minlow' ;

PRIMITIVE U5904 :
PA2 :
FPP0_FUNC :
1F = 'CPN minlow' ;

PRIMITIVE U5905 :
PA2 :
FPP0_FUNC :
1R = 'CPN minhigh' ;

PRIMITIVE U5906 :
PA2 :
FPP0_FUNC :
1R = 'CPN minhigh' ;

PRIMITIVE U5901 :
PA1_IKOS :
FPP1_FUNC :
2F = 'CPN minhigh' ;

PRIMITIVE U5908 :
PA1_IKOS:
FPP1_FUNC:
2F = 'CPN minlow' ;

PRIMITIVE U5902 :
PA2 :
FPP0_FUNC :
1R = 'D setup CPN 1h' :
1F = 'D setup CPN 1h' ;

PRIMITIVE D_HOLD_CP :
PA2 :
FPP0_FUNC :
3R = 'D hold CPN 1h' :
3F = 'D hold CPN 1h' ;
```

*FIG._5*

PRIMITIVENOT: FPP0: FPP0_FUNC ;
FAST_FLOP: FPP0: FPP0_FUNC ;
Q_FLOP: PA1_IKOS: FPP1_FUNC: 1R = 'CPN to Q 1h': 1F = 'CPN to Q hl' ;
CP_XDET: FPP0: FPP0_FUNC ;
DNEQ_XDET: FPP0: FPP0_FUNC ;
DNEQ_XOR: FPP0: FPP0_FUNC ;
DNEQ_OR: FPP0: FPP0_FUNC;
CPLL_NOR: FPP0: FPP0_FUNC ;
U5903: FPP0: FPP0_FUNC ;
CPLL_NAND: FPP0: FPP0_FUNC ;
CPLL_AND: FPP0: FPP0_FUNC ;
CP4FF_AND: FPP0: FPP0_FUNC ;
SET_AND: FPP1: FPP1_FUNC ;
CL_AND: FPP1: FPP1_FUNC ;
U5907: FPP0: FPP0_FUNC ;
U5901: PA1_IKOS: FPP1_FUNC: 2F = 'CPN minhigh' ;
U5908: PA1_IKOS: FPP1_FUNC: 2F = 'CPN minlow' ;
U5902: PA2: FPP0_FUNC: 1R = 'D setup CPN 1h': 1F = 'D setup CPN 1h' ;
D_HOLD_CP: PA2: FPP0_FUNC: 3R = 'D hold CPN 1h': 3F = 'D hold CPN 1h' ;
CP_MINLOW: PA2: FPP0_FUNC: 1F = 'CPN minlow' ;
U5904: PA2: FPP0_FUNC: 1F = 'CPN minlow' ;
U5905: PA2: FPP0_FUNC: 1R = 'CPN minhigh' ;
U5906: PA2: FPP0_FUNC: 1R = 'CPN minhigh' ;

FIG._6

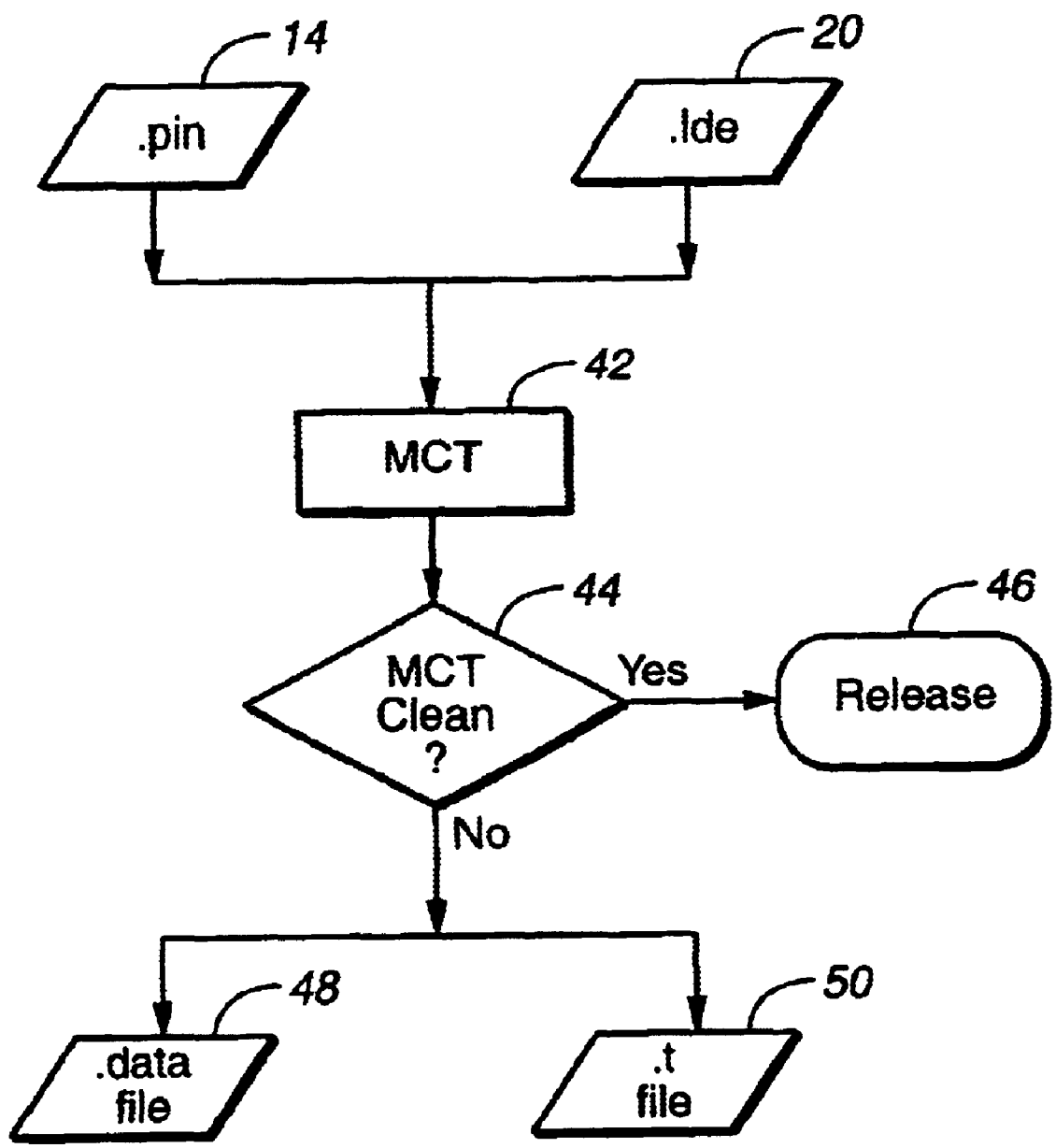
FIG._7

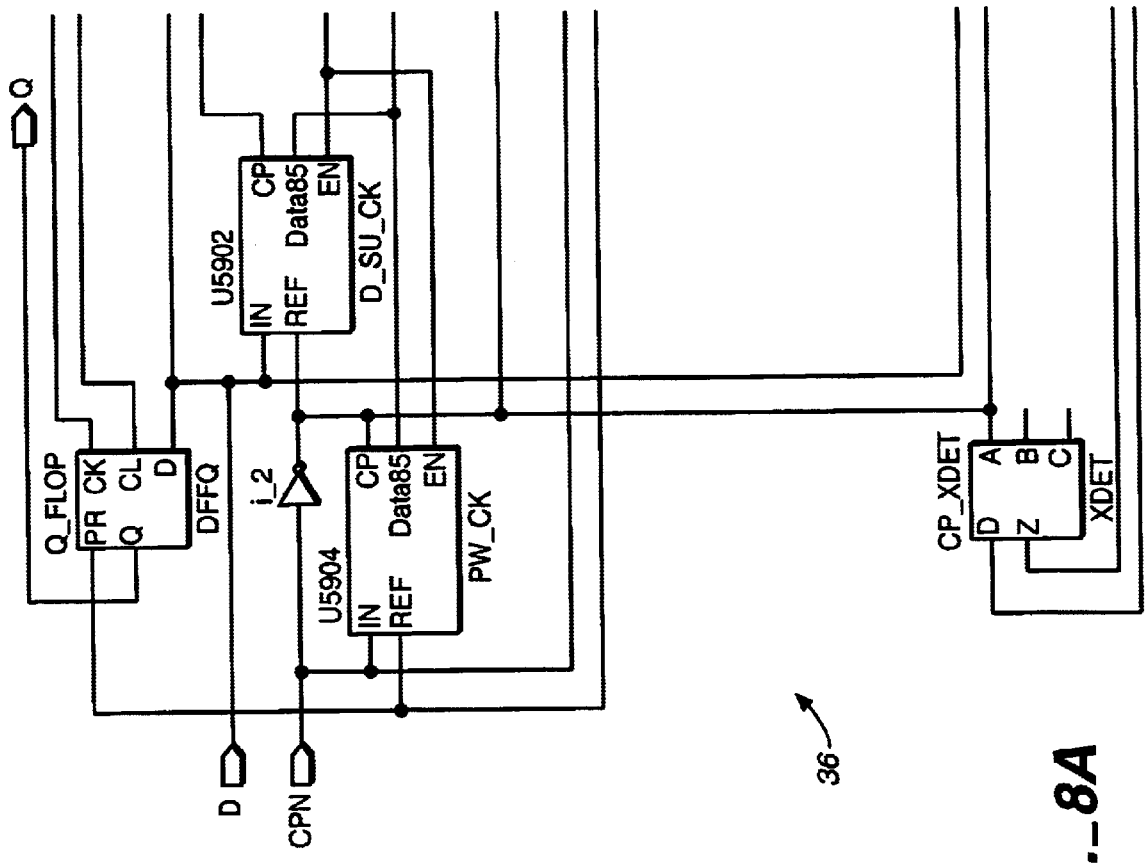
FIG._8A
FIG._8
FIG._8A | FIG._8B

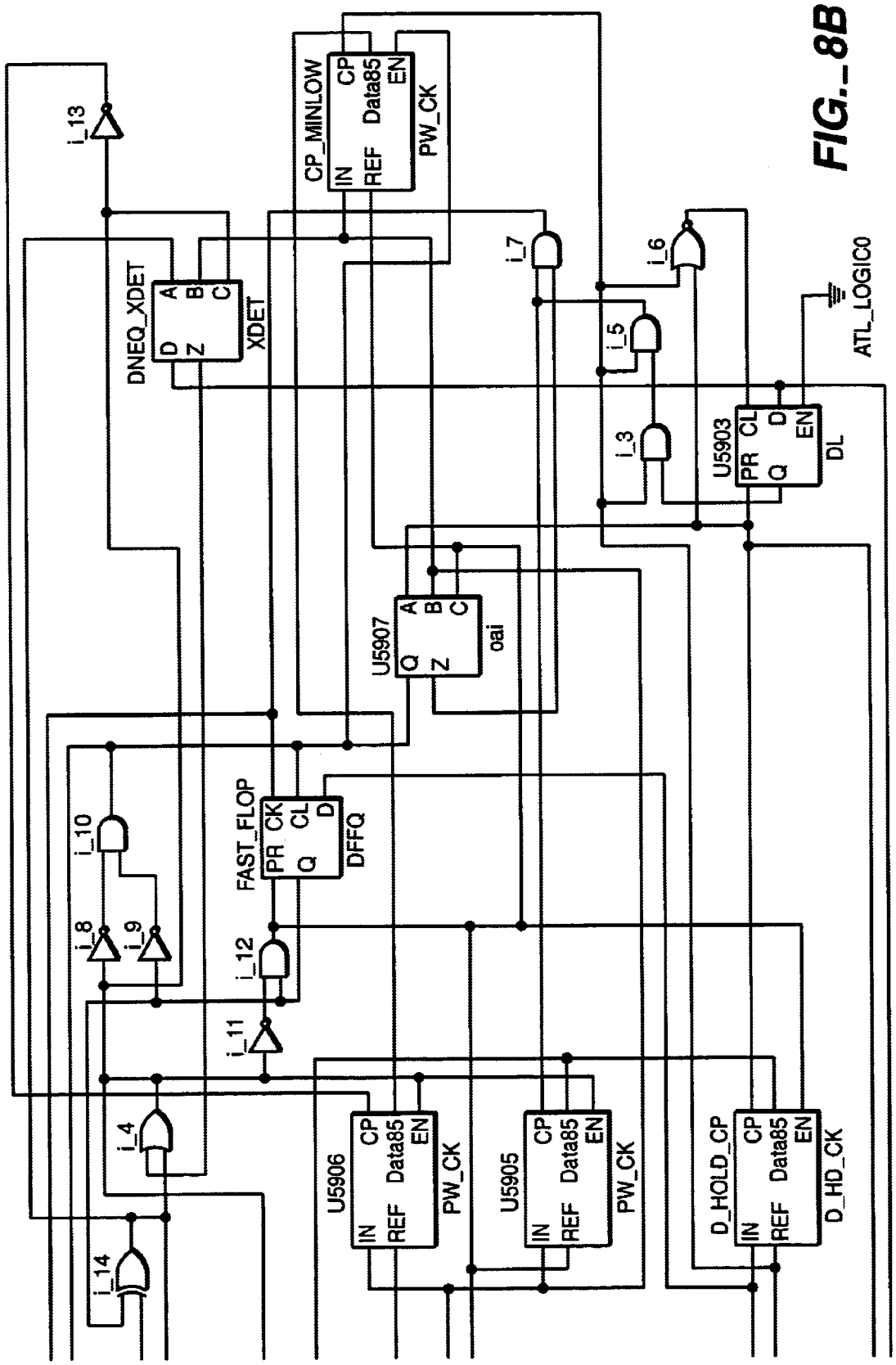
FIG._8B

METHOD TO DEBUG IKOS METHOD

REFERENCE TO COMPACT DISCS (CD-R's) FILED WITH THE APPLICATION

Duplicate compact discs (CD-R's) have been filed with the present application. Each compact disc contains a file called "getdata" (48.6 kB, created Oct. 31, 2001) which is an embodiment of the "getdata" script identified herein, and a file called "gencell" (54.5 kB, created Oct. 31, 2001) which is an embodiment of the "gencell" script identified herein. The material on the compact discs is incorporated herein by reference.

BACKGROUND OF THE INVENTION

The present invention generally relates to the field of ASIC design and software used for debugging simulation results at the gate level, and more specifically relates to a method of efficiently and accurately debugging IKOS models.

IKOS tools provide two basic flows for ASIC design. The first flow is a software-based flow wherein a netlist and test-bench are fed into the software simulator to validate functionality and timing of the design. The second flow is wherein a hardware accelerator is used to read in the synthesized version of the design netlist along with the test-bench for validating the design. This hardware flow increases throughput and hence turn-around times for design validation is markedly reduced compared to the software flow. Third party IKOS models or libraries for the Flex-Stream release (FS 2.0.2/FS 3.x) are built from their Verilog equivalents. These models are instantiated in a design netlist to model the functionality or timing of the ASIC being designed.

The typical IKOS model generation and DEBUG process is as follows: a Verilog model is created, an IKOS tool called a "Precision-Verilog to IKOS" or P-VLI reads in the Verilog model to create a .pin, .lde, .dat and .gbl file, all of which together comprise an IKOS model. The .gbl file is common to all cells for a specific technology. Hence, an IKOS model is primarily divided into the following components: a .pin file, a .lde file and a .dat file. Specifically, the functionality of the cell is represented in the .pin file, all the timing information for the cell is contained in the .lde file, and the default timing values for the cell are contained in the .dat file. Of these, the IKOS user mainly deals with the .pin and .lde files to build and validate (i.e. debug) an ASIC design. The .pin and .lde files are written in "Future Net" which is an IKOS proprietary language. This makes the .pin and .lde files very difficult to comprehend and almost impossible to hand-edit. In fact, the files are so complex that they do not effectively convey to a novice user any information about the circuit the file is trying to represent. Hence, debugging a typical IKOS model is relatively difficult and requires that one be very proficient at deciphering .pin and .lde files.

OBJECTS AND SUMMARY

A general object of an embodiment of the present invention is to effectively make the .pin and .lde files of an IKOS model readable and editable so that any functional and timing issues in the model can be efficiently and accurately fixed.

Another object of an embodiment of the present invention is to create an easy to adapt, user-friendly debugging flow for IKOS libraries.

Still another object of an embodiment of the present invention is to reduce turn around time for updates and fixes.

Yet another object of an embodiment of the present invention is to allow a user to better optimize for performance any given IKOS model.

Still yet another object of an embodiment of the present invention is to ensure a 1-to-1 correspondence between Verilog and IKOS views, in terms of model functionality.

Another object of an embodiment of the present invention is to provide a simple, easy to learn methodology which makes cross-training a lot easier.

Another object of an embodiment of the present invention is to incorporate Flexcheck methodology to handle negative timing checks (NTC), which is a FlexStream 3.0 requirement.

Still another object of an embodiment of the present invention is to be able to accommodate both 2.0.2 and 3.x FlexStream versions.

Briefly, and in accordance with at least one of the foregoing objects, an embodiment of the present invention provides a method of debugging an IKOS model, wherein the IKOS model includes a .pin file containing information relating to functionality of a cell, and the IKOS model includes a .lde file containing timing information for the cell. The method includes mapping information contained in either the .pin file, the .lde file or both into corresponding files which are more user-friendly, readable and editable. Preferably, a .v file which is readable to create a schematic view of the cell is also created and the schematic view can be viewed and analyzed. Then, the one or more user-friendly files which have been created can be read and edited, and the .pin and/or the .lde file is re-created. Then, a tool is used to analyze the .pin and .lde files again and determine whether there is a failure.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a flow diagram of an embodiment of the present invention, wherein information contained in the .pin and .lde files of an IKOS model are mapped into .data and .t files, respectively, which are more user-friendly, readable and editable;

FIG. 2 shows a first part of a representative .pin file of the IKOS model shown in FIG. 1;

FIG. 3 shows a second part of a representative .pin file of the IKOS model shown in FIG. 1;

FIG. 4 shows a representative .data file, wherein information contained in the .pin file shown in FIGS. 2 and 3 has been mapped into the .data file, and the .data file is more user-friendly, readable and editable than the .pin file;

FIG. 5 shows a representative .lde file of the IKOS model shown in FIG. 1;

FIG. 6 shows a representative .t file, wherein information contained in the .lde file shown in FIG. 5 has been mapped into the .t file, and the .t file is more user-friendly, readable and editable than the .lde file;

FIG. 7 is a flow diagram showing use of a tool ("MCT") for analyzing the .pin and .lde files; and FIG. 8 is a schematic diagram which has been generated from a .v file as shown in FIG. 1.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

An embodiment of the present invention provides a method of debugging an IKOS model. Specifically, the method includes mapping information contained in the .pin file of the IKOS model into a .data file which is more user-friendly, readable and editable than the .pin file, as well as mapping information contained in the .lde file of the IKOS model into a .t file which is more user-friendly, readable and editable than the .lde file. Then, depending on an analysis of the IKOS model, the .data and .t files can be read and edited, and the .pin and .lde files are re-created from the edited data and .t files. As such, the method effectively makes the .pin and .lde files of an IKOS model readable and editable so that any functional and timing issues in the model can be efficiently and accurately fixed. The method provides an easy to adapt, user-friendly debugging flow for IKOS libraries, and reduces turn around time for updates and fixes. The method also allows a user to better optimize for performance any given IKOS model, and ensures a 1-to-1 correspondence between Verilog and IKOS views, in terms of model functionality. The method provides a simple, easy to learn methodology which makes cross-training a lot easier, and incorporates Flexcheck methodology to handle negative timing checks (NTC), which is a FlexStream 3.0 requirement. Preferably, both 2.0.2 and 3.x FlexStream versions can be accommodated.

As shown in FIG. 1, a method in accordance with the present invention provides that an IKOS tool called a "Precision-Verilog to IKOS" or P-VLI (10) reads in a Verilog model (12) to create a .pin, .lde, .dat and .gbl file (14, 20, 16 and 18, respectively), all of which together comprise an IKOS model. The .gbl file (18) is common to all cells for a specific technology. Hence, the IKOS model is primarily divided into the .pin file, .lde file and .dat file (14, 20 and 16). While the functionality of the cell is represented in the .pin file (14), all the timing information for the cell is contained in the .lde file (20), and the default timing values for the cell are contained in the .dat file (16).

Script or code (i.e. computer readable program code) is provided ("getdata" 22 in FIG. 1), and is configured to map information contained in the .pin file (14) into a .data file (24) which is more user-friendly, readable and editable than the .pin file (14). Additionally, the "getdata" script or code (22) is configured to map information contained in the .lde file (20) into a .t file (26) which is more user-friendly, readable and editable than the .lde file (20). A specific example of script which can be used for "getdata" (22) in FIG. 1 is contained on the duplicate compact discs which have been filed herewith, and incorporated herein by reference above. The script contained on the compact discs is Perl script, however other script can be used. Alternatively, "getdata" may be written in C/C++.

Preferably, "getdata" (22) is configured to also create a .rplstr file (28) and a .v file (30). More specifically, preferably "getdata" (22) is configured such that it reads in the .pin file (14), the .lde file (20) or both, and creates the following:

a) .pin file (14) ---IN---> getdata (22) ---OUT---> .rplstr and .data files (28 and 24);

b) .pin file (14) ---IN---> getdata (with specific switch) (22) ---OUT---> .v file (30);

c) .pin file (14) and .lde file (20) ---IN---> getdata (22) ---OUT---> .t, .rplstr and data files (26, 28 and 24)

d) .pin file (14) and .lde file (20) ---IN---> getdata (with specific switch) (22) ---OUT---> .v file (30)

,wherein the .v file created in b) and d) are the same.

FIGS. 2–6 show some representative .pin, .data, .lde and .t files and generally illustrate the functionality of the script or code "getdata" shown in FIG. 1. For example, the .pin file may be as shown in FIGS. 2 and 3 (wherein FIG. 2 shows a first part of the file and FIG. 3 shows a second part of the file), and the "getdata" script or code may be configured to map information contained in the .pin file into a more user-friendly, readable and editable .data file as shown in FIG. 4. Likewise, the .lde file may be as shown in FIG. 5, and the "getdata" script or code may be configured to map information contained in the .lde file into a more user-friendly, readable and editable .t file as shown in FIG. 6.

As discussed above with regard to FIG. 1, in addition to the .pin and .lde files, the IKOS model also includes a .dat file (16). A representative .dat file may be as follows:

/////LDE Variables for Timing Check ///// var FDN1QA_tDelay_D_setup_CPN_hl_=0.000000;

var FDN1QA_tDelay_D_hold_CPN_hl_=0.031000;

var FDN1QA_tDelay_CPN_minhigh_=0.125000;

var FDN1QA_tDelay_CPN_minlow_=0.094000;

///// LDE Variables for Pin to Pin I/O Path Delay ///// var FDN1QA_tDelay_CPN_hl_to_Q_lh=0.182000;

var FDN1QA_tDelay_CPN_hl_to_Q_hl=0.165000;

As shown in FIG. 1, "getdata" (22) is preferably also configured to create a .rplstr file (28) and a .v file (30), wherein the .rplstr file contains information referenced by the .data file, and is typically used for changing the value on the input or output of primitives based on the state or transition of a notifier in the .data file. In essence, it is a place-holder for storing logic value information for a specific primitive output or input based on the value of a notifier referencing it. This file is created only for cells with timing checks. A representative .rplstr file may be as follows:

21 00-Z-FAST_FLOP-2;01-Z-Q_FLOP-2;03-Z-FAST_FLOP-3;04-Z-Q_FLOP-3;

23 00-Z-FAST_FLOP-2;01-Z-Q_FLOP-2;03-Z-FAST_FLOP-3;04-Z-Q_FLOP-3;

24 00-Z-FAST_FLOP-2;01-Z-Q_FLOP-2;03-Z-FAST_FLOP-3;04-Z-Q_FLOP-3;

25 00-Z-FAST_FLOP-2;01-Z-Q_FLOP-2;03-Z-FAST_FLOP-3;04-Z-Q_FLOP-3;

With regard to the .v file 30, the .v file is preferably a Verilog file which is readable by a tool (34) ("Ambit" in FIG. 1), to create a schematic view (36) of the cell, such as shown in FIG. 8, which helps in debugging connectivity, etc. A represenative .v file may be as follows:

```
`resetall
`timescale 1 ns/10 ps
`celldefine
module FDN1QA ( CPN,D,Q );
```

-continued

```
input CPN,D;
output Q;
supply0 GND;
supply1 PWR;
nand            (CP , CPN    );
DFFQ FAST_FLOP
(.Q(Q_FAST),.D(D),.CK(CP2FLOP),.CL(CL2FLOP),.PR(SET2FLOP)) ;
 DL U5903 (.Q(HOLDER),.D(VCC),.EN(GND),.CL(CPX_CL),.PR(CPX)) ;
 DFFQ.Q_FLOP (.Q(Q),.D(D),.CK(CP2FLOP),.CL(CL2FLOP),.PR(SET2FLOP)) ;
 nand           (CP_HELD , CP , HOLDER   ) ;
 PW_CKCP_MINLOW
(.Data85(DUM),.CP(CP),.IN(CPN),.EN(CL2FLOP),.REF(SET2FLOP)) ;
 or             (DNEQ , DXQX , DXQ     ) ;
 and            (s2 , CP , CP_HELD      ) ;
 PW_CK U5904 (.Data85(DUM),.CP(CP),.IN(CPN),.EN(s3),.REF(SET2FLOP)) ;
 nor            (CPX_CL , CP , CPX    ) ;
 and            (CP2FLOP , s2 , s4    ) ;
 XDET CP_XDET (.Z(CPX),.A(CP),.B(),.C(),.D(VCC)) ;
 PW_CK U5905 (.Data85(DUM),.CP(s2),.IN(CPN),.EN(s3),.REF(SET2FLOP)) ;
 XDET DNEQ_XDET (.Z(DXQX),.A(DXQ),.B(CPN),.C(s3),.D(VCC)) ;
 and            (CL2FLOP , ~DNEQ , ~Q_FAST  );
 D_SU_CK U5902 (.Data85(DUM),.CP(DXQ),.IN(D),.EN(s3),.REF(CP)) ;
 and            (SET2FLOP , ~DNEQ , ~Q_FAST  ) ;
 oai U5907 (.Z(s4),.A(CPX),.B(CPN),.C(SET2FLOP),.D(CL2FLOP)) ;
 PW_CK U5906 (.Data85(DUM),.CP(~DNEQ),.IN(CPN),.EN(s1),.REF(CP)) ;
 xor            (DXQ , Q_FAST , D    ) ;
 D_HD_CK D_HOLD_CP
(.Data85(DUM),.CP(CPX),.IN(D),.EN(SET2FLOP),.REF(CP)) ;
 and            (s3 , DNEQ        ) ;
 and            (s1 , DNEQ        ) ;
endmodule
`endcelldefine
```

In addition to the script or code "getdata" in FIG. 1, preferably additional script or code (40) ("gencell" in FIG. 1) is provided, and configured to re-create corresponding .pin and .lde files (14 and 20) which can again be analyzed. A specific example of script which can be used for "gencell" (40) in FIG. 1 is contained on the duplicate compact discs which have been filed herewith, and incorporated herein by reference above. The script contained on the compact discs is Perl script, however other script can be used. Alternatively, "gencell" may be written in C/C++.

Referring to FIG. 1, a method which is in accordance with an embodiment of the present invention provides as follows:

1. A Verilog model (12) is created;
2. An IKOS tool called a "Precision-Verilog to IKOS" or P-VLI (10) is used to read the Verilog model and create the IKOS model, including .pin and .lde files (14 and 20);
3. "getdata" (22) is run on the .pin and lde files (14 and 20) to create the .data, .v, .t. .rplstr files (24, 30, 26, 28, respectively);
4. The .v file (30) is read by a corresponding tool (34) ("AMBIT" in FIG. 1) to create a schematic (36) (see FIG. 8) that illustrates internal connectivity in the cell;
5. As shown in FIG. 7, a tool 42, such as a Model Certification Test tool ("MCT" in FIG. 7), is run on the IKOS model, and specifically the .pin and .lde files (14 and 20), to determine whether there is a functional or timing failure.
6. Based on the MCT results (box 44 in FIG. 7), the user releases the design (box 46) or reads and edits the .data file (box 48) and/or the .t file (box 50), and then runs "gencell" (40) (see FIG. 1) to re-create the .pin and .lde files (14 and 20).
7. The newly-created .pin and .lde files are again re-run through MCT, as shown in FIG. 7, to validate the cell.

This iterative process is continued until all issues with the cell are resolved.

The schematic created in STEP 4 helps a user to better understand the circuit, and makes editing the .data and .t files easier.

The method provides that the information contained in a .pin and/or .lde file of an IKOS model can be mapped into one or more corresponding files which are more user-friendly, readable and editable. As such, the method effectively provides that any functional and timing issues in the model can be efficiently and accurately fixed, and provides an easy to adapt, user-friendly debugging flow for IKOS libraries. The method preferably reduces turn around time for updates and fixes, allows a user to better optimize for performance any given IKOS model, and ensures a 1-to-1 correspondence between Verilog and IKOS views, in terms of model functionality. The method also provides a simple, easy to learn methodology which makes cross-training a lot easier, and preferably incorporates Flexcheck methodology to handle negative timing checks (NTC), which is a Flex-Stream 3.0 requirement. Preferably, both 2.0.2 and 3.x FlexStream versions can be accommodated.

It should be noted that all the files listed herein, on the attached FIGURES, and on the duplicate compact discs are ©LSI Logic Corporation 2001 and all rights are reserved.

While an embodiment of the present invention is shown and described, it is envisioned that those skilled in the art may devise various modifications of the present invention without departing from the spirit and scope of the appended claims.

What is claimed is:

1. A method of debugging an IKOS model, said IKOS model including a .pin file containing information relating to functionality of a cell, and said IKOS model including a .lde file containing timing information for the cell, said method comprising:

mapping information contained in at least one of the .pin file and .lde file into a corresponding file which is more readable and editable;

reading and editing said corresponding file; and re-creating at least one of the .pin and .lde files from the corresponding file.

2. A method as recited in claim 1, wherein the corresponding file is more user-friendly, readable and editable than the .pin and .lde files.

3. A method as recited in claim 1, further comprising creating a .v file which is readable to create a schematic view of the cell.

4. A method as recited in claim 3, further comprising using a tool to read the .v file and display the schematic view of the cell.

5. A method as recited in claim 1, further comprising after re-creating at least one of the .pin and .lde files, using a tool to analyze the .pin and .lde files and determine whether there is a failure.

6. A method as recited in claim 1, further comprising creating a .rplstr file if the cell includes timing checks, wherein the .rplstr file contains information referenced by the .data file, wherein the .rplstr file is configured to function as a place-holder for storing logic value information for a specific primitive output or input based on a value of a notifier in the .data file referencing the .rplstr file.

7. A method of debugging an IKOS model, said IKOS model including a .pin file containing information relating to functionality of a cell, and said IKOS model including a .lde file containing timing information for the cell, said method comprising:

mapping information contained in the .pin file into a .data file which is readable and editable;

mapping information contained in the .lde file into a .t file which is readable and editable;

reading and editing said .data file;

reading and editing said .t file; and re-creating the .pin and .lde files from the .data and .t files, respectively, which have been read and edited.

8. A method as recited in claim 7, wherein the .data and .t files are more user-friendly, readable and editable than the .pin and .lde files, respectively.

9. A method as recited in claim 7, further comprising creating a .v file which is readable to create a schematic view of the cell.

10. A method as recited in claim 9, further comprising using a tool to read the .v file and display the schematic view of the cell.

11. A method as recited in claim 7, after re-creating the .pin and .lde files from the .data and .t files, respectively, which have been read and edited, using a tool to analyze the .pin and .lde files and determine whether there is a failure.

12. A method as recited in claim 7, further comprising creating a .rplstr file if the cell includes timing checks, wherein the .rplstr file contains information referenced by the .data file, wherein the .rplstr file is configured to function as a place-holder for storing logic value information for a specific primitive output or input based on a value of a notifier in the .data file referencing the .rplstr file.

13. A method of debugging an IKOS model, said IKOS model including a .pin file containing information relating to functionality of a cell, and said IKOS model including a .lde file containing timing information for the cell, said method comprising:

mapping information contained in the .pin file into a .data file which is more user-friendly, readable and editable than the .pin file;

mapping information contained in the .lde file into a .t file which is more user-friendly, readable and editable than the .lde file;

creating a .v file which is readable to create a schematic view of the cell;

using a tool to read the .v file and display the schematic view of the cell;

reading and editing said .data file;

reading and editing said .t file;

re-creating the .pin and .lde files from the .data and .t files, respectively, which have been read and edited; and after re-creating the .pin and .lde files from the .data and .t files, respectively, which have been read and edited, using a tool to analyze the .pin and .lde files and determine whether there is a failure.

14. A method as recited in claim 13, further comprising creating a .rplstr file if the cell includes timing checks, wherein the .rplstr file contains information referenced by the .data file, wherein the .rplstr file is configured to function as a place-holder for storing logic value information for a specific primitive output or input based on a value of a notifier in the .data file referencing the .rplstr file.

15. Computer readable program code for use in debugging an IKOS model, said IKOS model including a .pin file containing information relating to functionality of a cell, and said IKOS model including a .lde file containing timing information for the cell, said computer readable program code configured to map information contained in the .pin file into a .data file which is readable and editable, and said computer readable program code configured to map information contained in the .lde file into a .t file which is readable and editable and computer readable program code configured to re-create the .pin and .lde files from the .data and .t files.

16. Computer readable program code as recited in claim 15, further comprising computer readable program code configured to create a .v file which is readable to create a schematic view of the cell.

17. Computer readable program code as recited in claim 15, further comprising computer readable program code configured to create a .rplstr file if the cell includes timing checks, wherein the .rplstr file contains information referenced by the .data file, wherein the .rplstr file is configured to function as a place-holder for storing logic value information for a specific primitive output or input based on a value of a notifier in the .data file referencing the .rplstr file.

18. Computer readable program code for use in debugging an IKOS model, said IKOS model including a .pin file containing information relating to functionality of a cell, and said IKOS model including a .lde file containing timing information for the cell, said computer readable program code configured to map information contained in the .pin file into a .data file which is readable and editable, said computer readable program code configured to map information contained in the .lde file into a .t file which is readable and editable, said computer readable program code configured to re-create the .pin and .lde files from the .data and .t files, said computer readable program code configured to create a .v file which is readable to create a schematic view of the cell, said computer readable program code configured to create a .rplstr file if the cell includes timing checks, wherein the .rplstr file contains information referenced by the .data file, wherein the .rplstr file is configured to function as a place-holder for storing logic value information for a specific primitive output or input based on a value of a notifier in the .data file referencing the .rplstr file.

* * * * *

UNITED STATES PATENT AND TRADEMARK OFFICE
CERTIFICATE OF CORRECTION

PATENT NO. : 6,691,288 B1 Page 1 of 1
DATED : February 10, 2004
INVENTOR(S) : Fakhry et al.

It is certified that error appears in the above-identified patent and that said Letters Patent is hereby corrected as shown below:

<u>Title page, Item [54] and Column 1, line 1,</u>
Title, should read -- METHOD TO DEBUG IKOS MODELS --

Signed and Sealed this

Twentieth Day of April, 2004

JON W. DUDAS
*Acting Director of the United States Patent and Trademark Office*